United States Patent [19]

Humphrey

[11] Patent Number: 4,820,190

[45] Date of Patent: Apr. 11, 1989

[54] ELECTRICAL COMPONENT MOUNTING AND CONNECTION ASSEMBLY

[75] Inventor: David T. Humphrey, Mechanicsburg, Pa.

[73] Assignee: E. I. Du Pont De Nemours and Company, Wilmington, Del.

[21] Appl. No.: 98,183

[22] Filed: Sep. 18, 1987

[51] Int. Cl.$^4$ .............................................. H01R 4/24
[52] U.S. Cl. .................................................. 439/395
[58] Field of Search ................................. 439/391–423

[56] References Cited

U.S. PATENT DOCUMENTS

| | | | |
|---|---|---|---|
| 4,585,290 | 4/1986 | Knickerlocker et al. | 439/395 |
| 4,679,881 | 7/1987 | Galvin et al. | 439/392 |
| 4,723,915 | 2/1988 | Tentry | 439/417 |
| 4,723,918 | 2/1988 | Lacroix | 439/397 |

Primary Examiner—Joseph H. McGlynn

[57] ABSTRACT

An electrical component mounting and connection assembly for direct connection to a connecting wire cable includes a base member having a cavity and wire-receiving slots into which the electrical leads of a sensor, such as a magnetically actuated reed switch, and the wires of the connecting cable are positioned. A cooperating insert member includes insulation displacing contacts and latching structures to physically latch the insert member and base member together to allow the insulation displacing contacts to establish electrical contact with the slot-retained wire conductors. The circuit wires follow a path to an exterior surface of the assembly to allow direct electrical probing of the wire ends to test the circuit components and their connections. In the preferred embodiment, the base member and insert define cooperating 'snap' together parts that allow time and cost efficient connection of the sensor device assemblies at the point of installation.

21 Claims, 3 Drawing Sheets

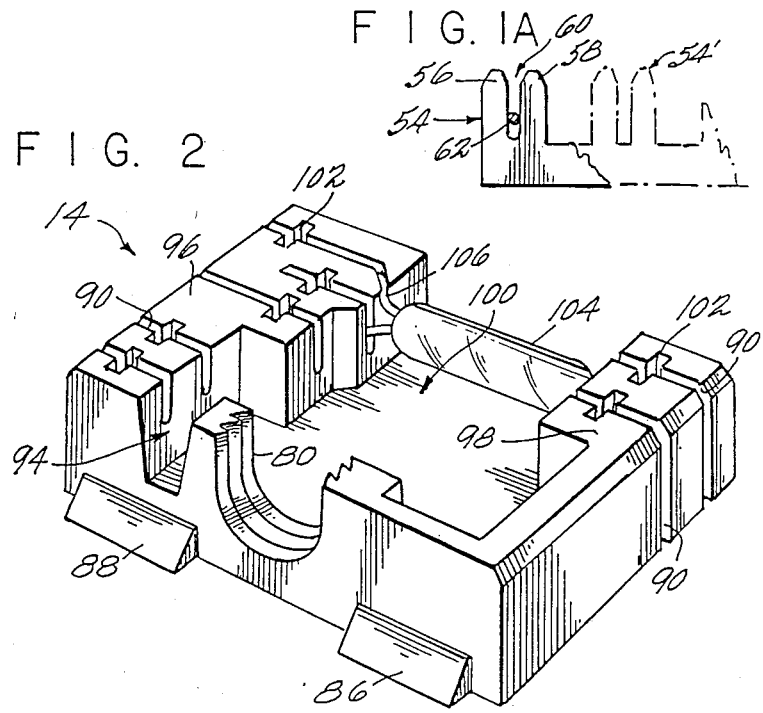
FIG. 1A
FIG. 2
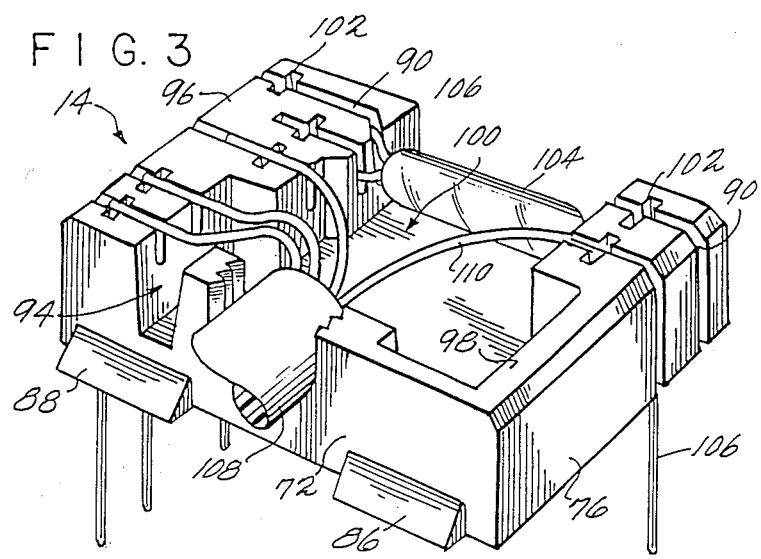
FIG. 3

ELECTRICAL COMPONENT MOUNTING AND CONNECTION ASSEMBLY

BACKGROUND OF THE INVENTION

The present invention relates to electrical component mounting and wiring assemblies and, more particularly, to sensor mounting assemblies that are connected to and function to terminate a wire cable.

Electrical sensors of various types are used to sense the position of a cooperating structure. In the intrusion alarm industry, sensors are used to detect unauthorized entry by determining the open or closed position of a window or door. The typical sensor includes a magnetically actuated reed switch that is mounted on the window frame or door jamb and which cooperates with a permanent magnet attached to the window or door. The sensor assemblies are mounted at the various 'point-of-entry' locations and connected through the wiring system to a central controller which can determine the open or closed state of the window or door.

One type of prior sensor assembly has been fabricated from a printed circuit board to which the magnetically actuated reed switch is physically secured and to which the switch leads are soldered. A fixed-length cable, typically with four conductors, is also soldered to appropriate traces on the printed circuit board to complete the circuit with the reed switch. The switch and circuit board are then positioned within a molded plastic housing and retained in place by an epoxy or silicone potting compound to provide a reliable, weatherproof device.

Another sensor mounting and connection device is disclosed in U.S. Pat. No. 4,679,881 to Galvin et al. and is designed to connect a plurality of sensor devices in series circuit. A box-like structure is provided with spaced, parallel slots and insulation displacement contacts for making electrical contact with the circuit conductors. The individual circuit wires are laid into the slots in general registration with the insulation displacement contacts. A cooperating component is provided with flanges which push the circuit wires into the insulation displacing contacts to establish electrical contact. A knife blade is also provided to sever excess wire to produce the series circuit connection.

The sensing device assemblies typically used in the intrusion alarm industry and their installation methods are generally satisfactory from the functional standpoint, although certain cost and performance drawbacks are present as a consequence of the manufacturing and installation techniques. For example, the sensor assemblies that use a printed circuit board and soldered connections must be fabricated in a production-type environment as contrasted to assembly in the field at the point of installation. The need to manufacture each sensor assembly with a fixed-length lead that is subsequently trimmed to length results in wasted cable and associated costs at the time of installation. These costs are increased when high-temperature PTFE insulation is used on the circuit wiring. Likewise, the splicing of the trimmed cable to the system wiring requires an additional increment of time on the part of skilled workers at the point of installation and, in some installations, such as store merchandise windows, the presence of junction boxes is aesthetically undesirable. The sensor assemblies that use insulation displacement contacts do allow circuit fabrication in the field, although the wire receiving slots do not positively retain the wires in place, and external mechanical disturbances of the wires can be transmitted to the insulation displacement contacts. It is known that any relative movement between the insulation displacement contact and its connected wire can adversely disturb the metal-to-metal seal and initiate conditions, such as corrosion couples, which degrade the integrity of the electrical connection. Since the wire conductors are mounted in individual slots accessible from the exterior of the assembly, the wire color-coding is visible, and, accordingly, aspects of the circuit wiring pattern can be ascertained. Lastly, the assembled sensors, especially those that are potted, do not allow convenient electrical probing of the reed switch or other circuit devices during or after installation to effect in-the-field testing.

SUMMARY OF THE INVENTION

In view of the above, it is an object of the present invention, among others, to provide an electrical device mounting and connection assembly for connecting an electrical device to and directly terminating the end of a cable.

It is another object of the present invention to provide an electrical device mounting and connection assembly that directly terminates the connected wiring and eliminates the need for an intermediate splice between the assembly and the wiring system.

It is another object of the present invention to provide an electrical component mounting and connection assembly that eliminates the need to effect soldered connections between the sensor device and its connected wiring.

It is a further object of the present invention to provide a sensor device mounting assembly that can be field assembled at the point of installation in a time and cost efficient manner.

It is still another object of the present invention to provide an electrical component mounting assembly that presents electrical test points that allow testing of the sensor.

In view of these objects, and others, the present invention provides an electrical component mounting and connection assembly that includes first and second cooperating members, the first member including an open-sided cavity into which the second member is inserted and retained. The first member includes lead retaining slots into which wire leads of the sensor device, such as a magnetically actuated reed switch, and the end of the system wiring cable are retained. The second member includes insulation displacing contacts connected in a desired circuit pattern. When the second member is inserted into the first member at the time of installation, the insulation displacing contacts penetrate the insulation of the wires retained in their respective slots in the first member and establish electrical contact with the wire conductors of the system wiring as well as the leads of the sensor device. The wire receiving slots follow a path that is effective to positively retain the wires in place and prevent any relative movement between the slot-retained wires and their insulation displacement contacts. The slot-retained wires follow a path to an exterior surface of the assembly to allow access to the wire ends by electrical test probes. The first and second members are latched together to define an electrical component mounting and connection assembly which is directly and reliably connected to the system wiring without the traditional need to effect a spliced connection between the sensor assembly and the system wiring or the need to effect soldered connections.

In the preferred embodiment, the assembly houses an electrical sensor device and includes a molded plastic base having an open-sided cavity formed therein and wire-receiving slots into which the electrical leads of the sensor device, such as a magnetically actuated reed switch, and the insulated wires of the connecting cable are positioned. A cooperating molded plastic insert member includes insulation displacing contacts connected together in a preferred circuit and latching structures to physically latch the insert member into the open-side cavity of the base member to allow the insulation displacing contacts to establish electrical contact with the slot-retained wire conductors and to provide a strain-relief for the system wiring cable. The wire-retaining slots follow a non-linear path and extend to an exposed face of the insert member to allow the excess wire to be trimmed flush with the face and thus present electrical test points that can be directly probed to test the sensing device. The various wires are retained in their slots in such a way that external mechanical disturbances of the connected wires do not disturb the metal-to-metal seal between the insulation displacement contacts and their respective conductors and thus assist in preserving the electrical integrity of the device.

The sensor device mounting assembly is field installable at the point of installation and is connected directly to and terminates the system wiring at the point of entry in a time and cost efficient manner.

Other objects and further scope of applicability of the present invention will become apparent from the detailed description to follow, taken in conjunction with the accompanying drawings, in which like parts are designated by like reference characters.

Figure 1:
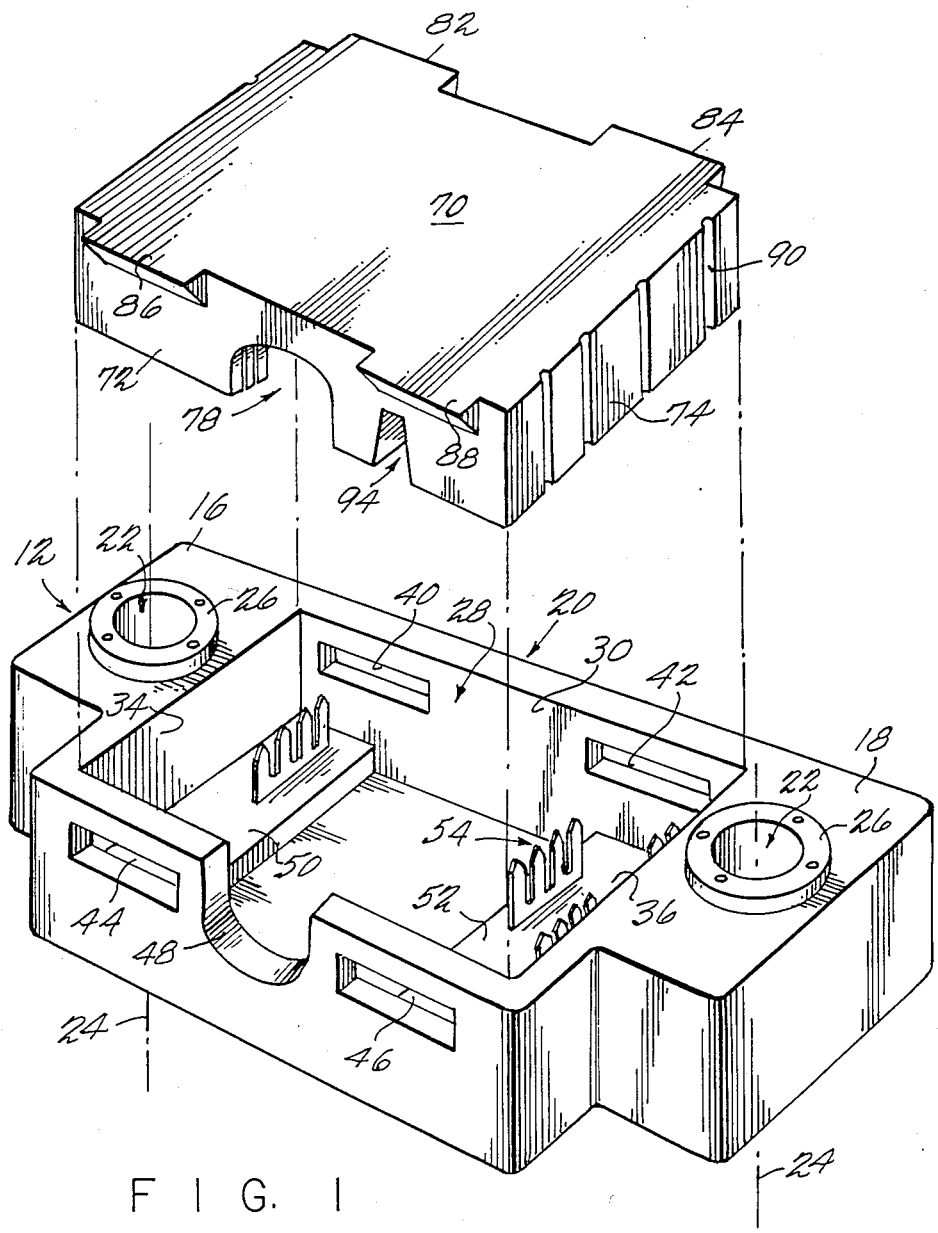
FIG. 1 is an exploded perspective view of a base and a connection block that is received within a cavity of the base.
Figure 4:
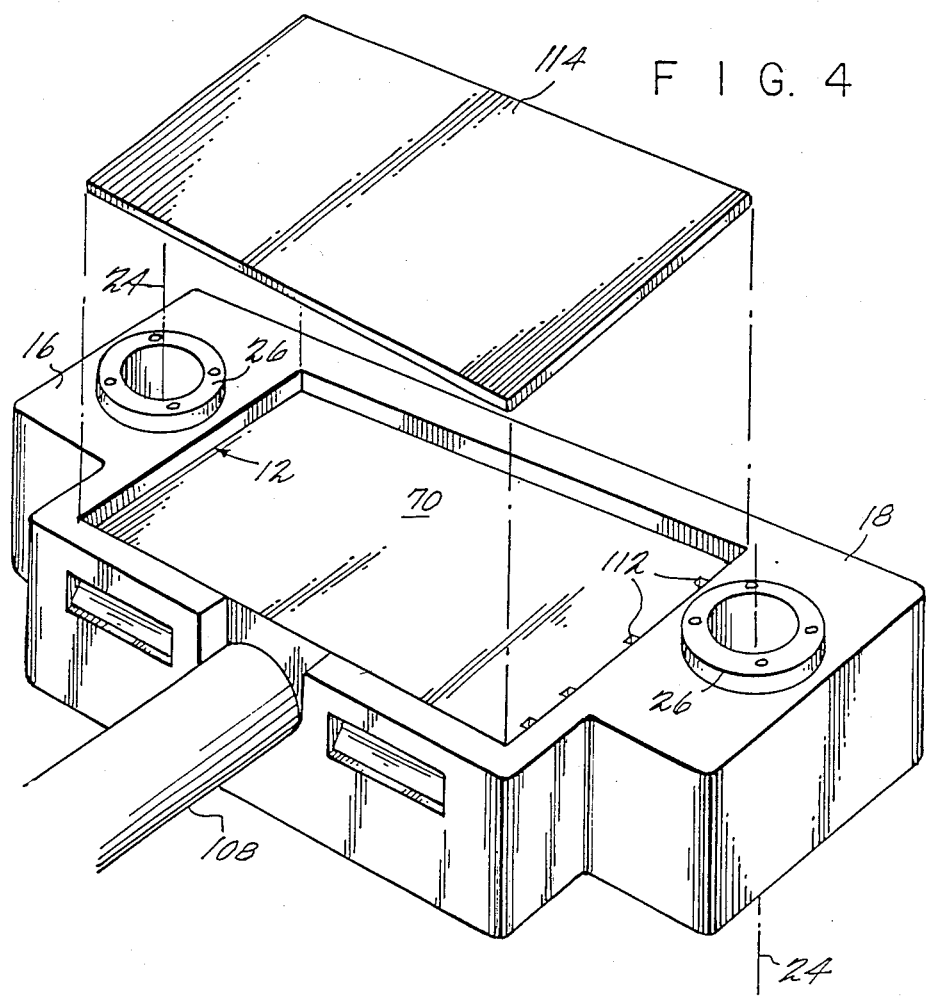
Figure 5:
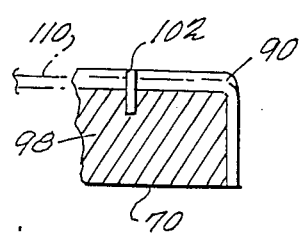
Figure 6:
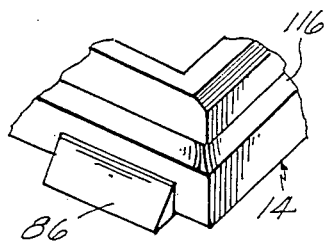

FIG. IA is a side elevational view of an exemplary insulation displacement contact of the type mounted in the base shown in FIG. 1;

FIG. 2 is a perspective view of the connection block of FIG. 1 from the side opposite that shown in FIG. 1 and with an exemplary reed switch mounted in its assembled position;

FIG. 3 is a perspective view of the connection block, similar to that of FIG. 2, with a multi-conductor wire cable mounted in its assembled position;

FIG. 4 is a perspective view of the assembled base and connection block;

FIG. 5 is a representative view, in partial cross-section, of a wire-guiding slot with an exemplary wire shown in dotted-line illustration; and FIG. 6 is a detailed view of a seal structure for sealing the base and the connection block of FIG. 1 in their assembled position.

DESCRIPTION OF THE PREFERRED EMBODIMENT

An electrical component mounting and connection assembly is shown in exploded perspective in FIG. 1 and designated generally therein by the reference character 10. As shown, the mounting and connection assembly 10 includes a base 12 and a component block 14 that is designed to engage the base 12 as described below. The base 12 is preferably molded as a unitary structure from a plastic, such as an electrical-grade nylon, poly vinyl chloride (PVC), or a polyester, and includes laterally extending mounting bosses 16 and 18 on opposite sides of a box-like, central portion 20. Each of the mounting bosses 16 and 18 includes a respective through bore 22 through which fasteners (not shown), aligned along axes 24, secure the mounting assembly 10 to a support surface. If desired, raised annular rims 26 can be provided adjacent to each through bore 22 to space the mounting assembly I0 above any irregularities on its support surface. The central portion 20 includes an open, interior cavity 28 defined by opposed sidewalls 30 and 32, endwalls 34 and 36, and a bottom wall 38. The sidewall 30 is provided with rectangular apertures 40 and 42, and, in a similar manner, the sidewall 32 is provided with rectangular apertures 44 and 46. As explained more fully below, the various apertures assist in securing the component block 14 in its assembled position within the cavity 28 of the base 12. A "U"-shaped, semi-circular opening 48 is provided in the sidewall 32 and assists, as explained below, in capturing and retaining an electrical cable. Raised ledges 50 and 52 are provided on the bottom wall 38 adjacent the endwalls 34 and 36, respectively, and support insulation displacement contacts, generally indicated at 54.

As shown in the detail of FIG. 1A, each insulation displacement contact 54 is defined as an upstanding bifurcated tab with spaced apart tines 56 and 58 defining a wire-accepting slot 60 therebetween. The insulation displacement contact 54 functions to establish a reliable electrical connection with a conductor, indicated generally at 62, that is captured within the slot 60. More specifically, the insulation displacement contact 54 is mounted upon an insulated or uninsulated wire in a plane transverse to the longitudinal axis of the wire with the wire positioned at the mouth of the slot 60. The insulation displacement contact 54 is pushed onto the wire or, conversely, the wire is pushed into the slot 60, so that the inwardly facing edges of the tines 56 and 58 penetrate the insulation, where the wire is insulated, and a portion of the surface of the conductor 62 to assure a reliable electrical connection. As shown in dotted line illustration in FIG. 1A, one or more insulation displacement contacts 54' can be formed adjacent to the first insulation displacement contact 54 to effect an electrical connection between different wire conductors. As explained below, the various insulation displacement contacts 54 of the base 12 are interconnected to provide a desired circuit. The insulation displacement contacts 54 are typically fabricated from stamped phosphor bronze or beryllium copper and include barbed tabs (not shown). The insulation displacement contacts 54 are installed by pressing the barbed ends into appropriate receiving slots (not shown) molded into the ledges 50 and 52 of the base 12. In the alternative, the insulation displacement contacts 54 can be molded directly into the material from which the base 12 is formed.

As shown in FIGS. 1 and 2, the component block 14 is formed as a generally rectangular member defined by a top surface 70, sidewalls 72 (only one of which is illustrated), and endwalls 74 and 76. A "U"-shaped, semi-circular opening 78 is provided in the sidewall 72 and cooperates with the similarly shaped opening 48 (FIG. 1) to retain a wiring cable in place as described below. If desired, the surface that defines the opening 78 can be provided with a series of repeating striations 80 to assist in retaining the wiring cable in place. Latching lugs 82 and 84 extend outwardly of the sidewall 72, and, in a similar manner, latching lugs 86 and 88 extend outwardly from the opposite sidewall. The latching lugs 82 and 84 are designed to be received by the rectangular apertures 40 and 42 of the base 12, and, in a similar manner, the latching lugs 86 and 88 are designed to be received by the rectangular apertures 44 and 46. The lug and aperture arrangement allows the component block 14 to be inserted into the cavity 28 of the base 12 and 'snapped' into its final, assembled position at the point of installation as explained below. In order to assure this snap-together feature, it is preferable that the plastic or other material from which the parts are fabricated has sufficient resilience to allow assembly without unduly stressing the material. A plurality of wire receiving slots 90 are formed in the endwalls 74 and 76 and are designed to retain and guide various component leads and wires. As best shown in FIGS. 2 and 3, a "V"-shaped notch 94 is formed in the sidewall 72. The notch 94 serves to provide a measure of clearance space for the connection of one of the wires as explained below.

As shown in FIG. 2, the underside of the component block 14 includes raised, laterally spaced abutments 96 and 98 that define a cavity 100 therebetween and the surfaces of the endwalls 74 and 76. The various wire-receiving slots 90 formed in the endwalls 74 and 76 extend through the abutments 96 and 98 to face the cavity 100. A transversely aligned slot 102 is formed in intersecting relationship with each of the wire-receiving slots 90 and has a width dimension sufficient to receive the insulation displacement contacts 54 of the base 12 as explained below. As shown in the partial cross-sectional view of FIG. 5, the wire-receiving slots 90 are formed so that a wire (dotted line illustration) positioned in a slot is constrained along a path that includes first and second perpendicular linear portions joined by a radiused or curvilinear portion. As explain below, constraining a wire in this manner protects the metal-to-metal seal at the insulation displacement contact 54 from external mechanical disturbances of the wire.

In order to use the mounting assembly 10 to install a sensor, for example, at a point of entry location and as shown in FIGS. 2 and 3, a sensor 104, such as a magnetically actuated reed switch, is mounted between the abutments 96 and 98 with its leads 106 positioned in respective wire-receiving slots 90. The leads 106, as shown in FIG. 3 and in FIG. 5, are pulled into their respective slots 90 and are re-directed from their initial alignment from the sensor 104 to a right angle relationship to extend perpendicularly from the surface 70. An electrical cable 108 to which the sensor 104 is to be electrically connected is positioned with its outer insulating jacket in the "U"-shaped slot 78 to be gripped by the striations 80 and with the various wires 110 carried within the cable 108 placed in respective wire-receiving slots 90. The wires 110 are pulled into their respective slots 90 and bent at a right angle to extend normally from the surface 70, as represented in FIG. 5. After the various wires and leads are positioned in their respective wire-receiving slots 90, the excess portions thereof are trimmed flush with the surface 70 using end-cutting pliers.

With the sensor 104 and the cable 108 and its wires 110 mounted in the component block 14 as described, the component block 14 is aligned in general registration with the cavity 28 of the base 12, as represented in FIG. 1, and the two components pressed together until the component block 14 is fully received within the base 12 and the various latching lugs engage their respective apertures as explained above. As shown in FIG. 4, the two components form the assembled mounting and connection assembly 10 and terminate the cable 108. The "U"-shaped slot 48 of the base 12 cooperates with the similarly shaped slot 78 of the component block 14 to fully capture and retain the cable 108 so that external mechanical disturbances of the cable 108 are not transferred through the various wires 110. As the insulation displacement contacts 54 enter their respective slots 102, they function to fully 'seat' their conductor or wire in the wire-receiving slot 90 with the inwardly facing surfaces of the spaced tines 56 and 58 (FIG. 1A) penetrating the insulation and the surface of the conductor 60 to establish a reliable metal-to-metal electrical contact with the conductor 60 and, concurrently, interconnect the various wires in the desired circuit, depending upon how the various insulation displacement contacts 54 are connected. As shown n FIG. 5, the insulation displacement contact 54 engages a wire 110 at a point spaced from the remote end of the wire so that the wire is supported on both sides of and immediately adjacent the insulation displacement contact 54. The depth of each slot 90 is selected to assure that the wire will be properly supported, that is, 'fixtured' as the respective insulation displacement contact 54 is pressed into position.

As shown in FIG. 4, the various wires and leads that were flush-cut with the surface 70 present convenient test-probe points 112 that allow the internal circuitry and the sensor 104 to be tested at the point of installation. If desired and as shown in FIG. 4, an appropriately shaped sheet 114 of insulating material, such as a flexible plastic, can be adhesively secured to the surface 70 to seal the various test points 112 and the interface between the two components. As can be appreciated, the assembled unit completely covers the interconnected wires so that their color coding is not visible from the exterior of the assembled parts, in contrast to prior field-assembled devices.

If desired, the component block 14 or the base 12 can be provided with a discrete seal to assist in weatherproofing the assembled parts. For example and as shown in FIG. 6, a ridge 116 is formed on the exterior wall surfaces of the component block 14 to assist in providing a weather-resistant interface between the assembled components. A hermetically sealed structure can be obtained, for example, by depositing an oversupply of uncured epoxy or RTV compound in the cavity 28 of the base 12 prior to assembly with the excess material extruded from between the parts as they are assembled. In the alternative, a layer of uncured RTV compound can be deposited into the cavity 28 at the time of manufacture and protected in its uncured state by an impermeable peel-away membrane or sheet. The sheet is peeled off at the time of installation and the base 12 and its connection block 14 assembled as described to provide a weatherproof device that can be subjected to electrical testing in the field via the test points 112.

In the embodiment described above, the component block 14 and the base 12 have been described as separate components. If desired, the component block 14 and the base 12 can be connected by one or more hinges or straps that are formed at the time the component block 14 and base 12 are molded. The sensor device has been described as a magnetically actuated switch having conductor leads that extend axially outward from the opposite ends of the switch body. As can be appreciated, other sensor devices, such as Hall-effect devices and inductor coils that respond to an electro-magnetic field are likewise suitable as well as other electrical devices having leads that extend from the same side of the device body. In this latter case, only a single abutment is required to effect the desired electrical connections.

The present invention advantageously provides a mounting assembly for a sensor which directly terminates the cabling to which the sensor is connected, which eliminates the need to effect a spliced connection, eliminates the need for fixed-length leads and the associated waste typically associated with prior art devices and their installation method, and which allows direct electrical testing of the internal components and their interconnections.

Thus it will be appreciated from the above that as a result of the present invention, an electrical component mounting and connection assembly is provided by which the principal objectives, among others, are completely fulfilled. It will be equally apparent and is contemplated that modification and/or changes may be made in the illustrated embodiment without departure from the invention. Accordingly, it is expressly intended that the foregoing description and accompanying drawings are illustrative of preferred embodiments only, not limiting, and that the true spirit and scope of the present invention will be determined by reference to the appended claims and their legal equivalent.

What is claimed is:

1. An electrical component mounting and connection assembly comprising:
   a connector block having at least one abutment having slots of a first type formed therein for receiving electrical conductor leads and having a slot of a second type associated with each of the slots of the first type, the slot the second type transverse to and intersectioning the slots of the first type, the slots of the first type defining respective conductor lead guiding paths, each having first and second path portions aligned at a selected angle relative to another and joined by an intermediate curvilinear portion;
   a base member for intergaging said connector block to form an assembly;
   a plurality of insulation displacement contacts mounted in said base member and positioned to be received within the slots of the second type, each said contact having a first and second spaced apart tines defining a conductor receiving slot therebetween, the contacts being insertable into the slots of the second type to establish electrical connection with conductor leads received in the respective slots of the first type; and
   means for retaining a wiring cable to said assembled connector block and base member.

2. The mounting and connection assembly of claim 1, wherein said first and second path portions are aligned at a right angle relative to one another.

3. The mounting and connection assembly of claim 1, wherein said connector block comprises at least two spaced apart abutments, each abutment having slots of the first type formed therein for receiving electrical conductor leads and having a slot of the second type associated with each of the slots of the first type, the slots of the second type transverse to and intersecting the slots of the first type.

4. The mounting and connection assembly of claim 1, wherein an end of at least one of the slots of the first type presents a probe point when said connector block and base member are assembled together.

5. The mounting and connection assembly of claim 1, further comprising:
   an electrical sensor device having at least first and second leads received with respective slots of the first type of the spaced apart abutments.

6. The mounting and connection assembly of claim 5, wherein said electrical sensor device comprises:
   a magnetically responsive reed switch.

7. The mounting and connection assembly of claim 7, further comprising:
   means for latching said connector block and said base member into engagement with one another.

8. The mounting and connection assembly of claim 7, wherein said means for latching comprises:
   at least one outwardly extending tab on a one of said connector block and said base member and a cooperating aperture on the other of said connector block and said base member.

9. The mounting and connection assembly of claim 7, wherein said means for latching comprises:
   at least first and second outwardly extending tabs on said connector block, said base member having respective first and second cooperating apertures formed therein to receive said tabs.

10. An electrical sensor mounting and connection assembly comprising:
    a connection block having at least one abutment having slots of a first type formed therein for receiving electrical conductor leads and having a slot of a second type associated with each of the slots of the first type, the slots of the second type transverse to and intersecting the slots of the first type and positioned intermediate the ends of the slots of the first type, the slots of the first type defining respective conductor lead guiding paths;
    an electrical sensor device having at least first and second leads received within respective slots of the first type;
    a base member for interengaging said connector block to form an assembly;
    means defining wire connectors mounted in said base member and positioned to be received within the slots of the second type to establish electrical connection with conductor leads received in the respective slots of the first type; and
    means for retaining a wiring cable to said assembled connector block and base member;
    whereby when said connector block and base member are interengaged to form said assembly, the ends of said slots of the first type present test probe points at an exposed surface of the assembly to allow for electrical testing of the sensor.

11. The mounting and connection assembly of claim 10, wherein said connector block comprises at least two spaced apart abutments, each abutment having slots of the first type formed therein for receiving electrical conductor leads and having a slot of the second type associated with each of the slots of the first type, the slots of the second type transverse to and intersecting the slots of the first type.

12. The mounting and connection assembly of claim 10, wherein said wire connector means comprise:
    first and second paced apart tines defining a conductor receiving slot therebetween, the tines insertable into slots of the second type to effect electrical contact with an electrical conductor received in the respective slot of the first type.

13. The mounting and connection assembly of claim 10 wherein said electrical sensor device includes a magnetically responsive reed switch.

14. The mounting and connection assembly of claim 10, further comprising:
   means for latching said connector block and said base member into engagement with one another.

15. The mounting and connection assembly of claim 14, wherein said means for latching comprises:
   at least one outwardly extending tab on a one of said connector block and said base member and a cooperating aperture on the other of said connector block and said base member.

16. The mounting and connection assembly of claim 14, wherein said means for latching comprises:
   at least first and second outwardly extending tabs on said connector block, said base member having respective first and second cooperating apertures formed therein to receive said tabs.

17. The mounting and connection assembly of claim 10, wherein the slots of the first type define respective conductor lead guiding paths having at least first and second portions.

18. The mounting and connection assembly of claim 17, wherein said first and second path portions are linear.

19. The mounting and connection assembly of claim 18, wherein said first and second path portions are aligned at a selected angle relative to one another.

20. The mounting and connection assembly of claim 19, wherein said first and second path portions are aligned at a right angle relative to one another.

21. The mounting and connection assembly of claim 19, wherein said first and second path portions are joined by an intermediate curvilinear portion.

* * * * *